United States Patent
Clara et al.

(10) Patent No.: US 8,547,268 B2
(45) Date of Patent: Oct. 1, 2013

(54) SWITCHED CURRENT-CELL WITH INTERMEDIATE STATE

(75) Inventors: Martin Clara, Villach (AT); Daniel Gruber, St. Andrae (AT); Klatzer Wolfgang, Mittertrixen (AT)

(73) Assignee: Lantiq Deutschland GmbH, Neubiberg (DE)

( * ) Notice: Subject to any disclaimer, the term of this patent is extended or adjusted under 35 U.S.C. 154(b) by 0 days.

(21) Appl. No.: 13/408,691

(22) Filed: Feb. 29, 2012

(65) Prior Publication Data
US 2013/0222168 A1    Aug. 29, 2013

(51) Int. Cl.
*H03M 1/66* (2006.01)
(52) U.S. Cl.
USPC .......................................... 341/144; 341/155
(58) Field of Classification Search
USPC .................. 341/144, 155, 150, 135, 136
See application file for complete search history.

(56) References Cited

U.S. PATENT DOCUMENTS

| | | | | |
|---|---|---|---|---|
| 6,313,776 B1* | 11/2001 | Brown | | 341/144 |
| 6,906,652 B2* | 6/2005 | Bugeja | | 341/145 |
| 6,972,625 B2* | 12/2005 | Nguyen et al. | | 330/254 |
| 7,924,197 B1* | 4/2011 | Liu et al. | | 341/144 |
| 7,982,650 B2* | 7/2011 | Lee et al. | | 341/144 |
| 2012/0127138 A1* | 5/2012 | Tsuchi | | 345/204 |

* cited by examiner

*Primary Examiner* — Peguy Jean Pierre
(74) *Attorney, Agent, or Firm* — SpryIP, LLC

(57) ABSTRACT

Representative implementations of devices and techniques provide digital-to-analog conversion of signals while minimizing switching related errors. Digital to analog converter (DAC) cells may be arranged to include one or more operating states in addition to binary output states, and may employ a switching technique to "dump" the DAC cell between binary outputs. Further, an array of DAC cells may include a partial set of redundant DAC cells for implementation of the switching technique.

30 Claims, 9 Drawing Sheets

US 8,547,268 B2

1

SWITCHED CURRENT-CELL WITH INTERMEDIATE STATE

BACKGROUND

Digital-to-analog converters (DACs, D/A-converters) constitute a basic building block in modern integrated-circuit (IC) design, since they form the ubiquitous digital-to-analog interface in digital transceivers and digitally aided control loops. Current steering DACs are used whenever a certain minimum sampling speed is required.

In general, a current-steering DAC responds to a digital input code by outputting a current that is proportional to the digital representation. Thus, the magnitude of the output current changes with changes to the digital input code. Moreover, in certain current-steering DACs that implement multiple current cells, any of the current cells may switch output states in response to a digital input code, producing a variable current output from a varying digital input.

In contrast to, for example, switched-capacitor realizations, standard implementations of current-steering DACs are be transparent for non-ideal error signals that are generated during code changes, i.e. when the DAC switches from one input code to the next. These errors may include switch injection, asymmetries in the ON/OFF transitions, settling of internal nodes, and other non-ideal effects generated during switching of the current cells. Because the number of current cells that switch during a transition is dependent on the input code sequence, nonlinear distortion may result from these effects.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

2

DETAILED DESCRIPTION

Overview

Representative implementations of devices and techniques provide digital to analog conversion of signals while minimizing switching related errors. Digital to analog converter (DAC) cells may be arranged to include one or more operating states in addition to binary output states. This may be accomplished by adding one or more switched outputs to the DAC cell that have access to the output of the current source of the DAC cell. The additional operating states may include a "dump" state arranged to allow a modification to the internal capacitance charge or to the voltage at the output of the current source between binary output states. For example, a switching technique can be used to switch a DAC cell to a dump state before switching the polarity of the DAC cell from a positive state (e.g., "ON") to a negative state (e.g., "OFF"), or vice versa. While in the dump state, the DAC cell may be discharged, pre-charged, reset, or the like.

Further, an array of DAC cells may be arranged to include a partial set of redundant DAC cells. With the addition of the redundant DAC cells, the switching algorithm can be applied on some or all of the DAC cells in the array, switching a DAC cell to a "dump" state before switching the polarity of the DAC cell between binary output states. In some implementations, a limited number of redundant cells is used in combination with the switching technique, resulting in "partial return-to-zero" functionality.

Various implementations for minimizing switching errors, including techniques and devices, are discussed with reference to the figures. The techniques and devices discussed may be applied to any of various DAC designs, circuits, and devices and remain within the scope of the disclosure.

Implementations are explained in more detail below using a plurality of examples. Although various implementations and examples are discussed here and below, further implementations and examples may be possible by combining the features and elements of individual implementations and examples.

Example DAC Cell

Figure 1:
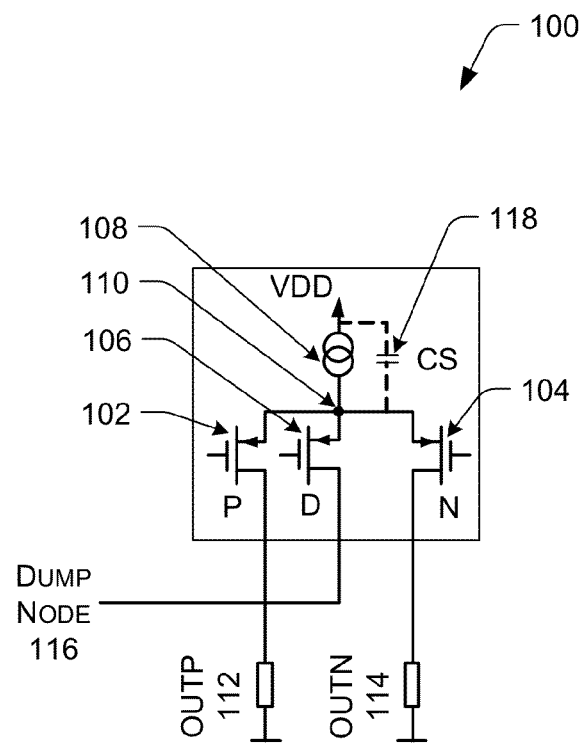
FIG. 1 is schematic of an example digital-to-analog (DAC) cell in which the techniques in accordance with the present disclosure may be implemented.

FIG. 1 is schematic of an example DAC cell 100 in which the techniques in accordance with the present disclosure may be implemented. While the example DAC cell 100 is illustrated as a current-steering DAC cell and the disclosure discusses current-steering type DAC cells, various other types of DAC cells may employ techniques and/or devices discussed herein. Accordingly, the generic term "DAC cell" is used throughout.

The example DAC cell 100 of FIG. 1 is comprised of three switches (102, 104, and 106), illustrated as PMOS transistors. However, NMOS transistors, or other transistor types, may also be used to implement the switches (102, 104, and 106). The switches are also marked in FIG. 1 according to their polarity. Switch 102 ("P") is a positive (e.g., "ON") state switch, switch 104 ("N") is a negative (e.g., "OFF") state switch, and switch 106 ("D") is a "dump" state switch. In alternate implementations, as discussed further below, a DAC cell 100 may have additional switches as well.

The switches (102, 104, and 106) control the current output from the DAC cell 100. Each of the switches (102, 104, and 106) is coupled at a first terminal (the source of the transistor, for example in the case of a PMOS transistor) to the output of a current source 108. (The common node at the output of the current source 108 is shown in FIG. 1 as node 110.) Switches 102 and 104 are coupled at the second terminal (the drain of the transistor, for example in the case of a PMOS transistor) of the switches to the positive output (outp) 112 of the DAC cell 100 and the negative output (outn) 114 of the DAC cell 100, respectively. Closing one of the switches 102 or 104 (based on a signal at the gate of the switch) couples the output of the current source 108 to outp 112 or outn 114 respectively, causing current to flow through the respective output and determining the output state (or output mode) of the DAC cell 100.

Switch 106 is coupled at the second terminal (the drain of the transistor, for example) of the switch to a dump node 116. In one implementation, switch 106 is arranged to discharge the parasitic capacitance 118 connected at the output of the current source 108 when closed. In alternate implementations, as will be discussed, switch 106 may be arranged to pre-charge or reset node 110 when closed. Thus, switch 106 may be used in conjunction with switching techniques to reset, normalize, pre-charge, discharge, etc. the DAC cell 100 between polarity changes to the DAC cell 100.

As shown in FIG. 1, an internal capacitance ("Cs") 118 associated with the current source 108 may exist in the DAC cell 100. In an example, the capacitance Cs 118 is charged to a voltage that is dependent on the voltage at the drain of the transistor switch (102 or 104) that is active (e.g., closed, passing current). When the DAC cell 100 is switched from one output to the other output (i.e., outputs 112 and 114), the voltage across the capacitance Cs 118 changes and the stored charge may flow into the active output, generating a signal dependent error that can limit the dynamic linearity of the DAC.

In one implementation, the capacitance Cs 118 is reset prior to the DAC cell 100 switching polarity. For example, Cs 118 may be discharged or pre-charged in order to make the charge flowing into the active output after the polarity change of the DAC cell 100 signal independent. In an implementation, discharging or pre-charging the DAC cell 100 comprises disconnecting (i.e., deactivating) both outputs (outp 112 and outn 114) and connecting (i.e., activating) an intermediate output, i.e, the dump node 116, before changing the DAC cell 100 output polarity. In other words, the switch 106 may be arranged to discharge a voltage at the output of the current source 108 (i.e., discharge Cs 118) prior to one of switch 102 or switch 104 toggling when the other of switch 102 or switch 104 has toggled (i.e., a change in polarity of the DAC cell 100). Alternately, the switch 106 may be arranged to pre-charge a voltage at the output of the current source 108 (i.e., pre-charge Cs 118) prior to one of switch 102 or switch 104 toggling when the other of switch 102 or switch 104 has toggled.

Figure 2:
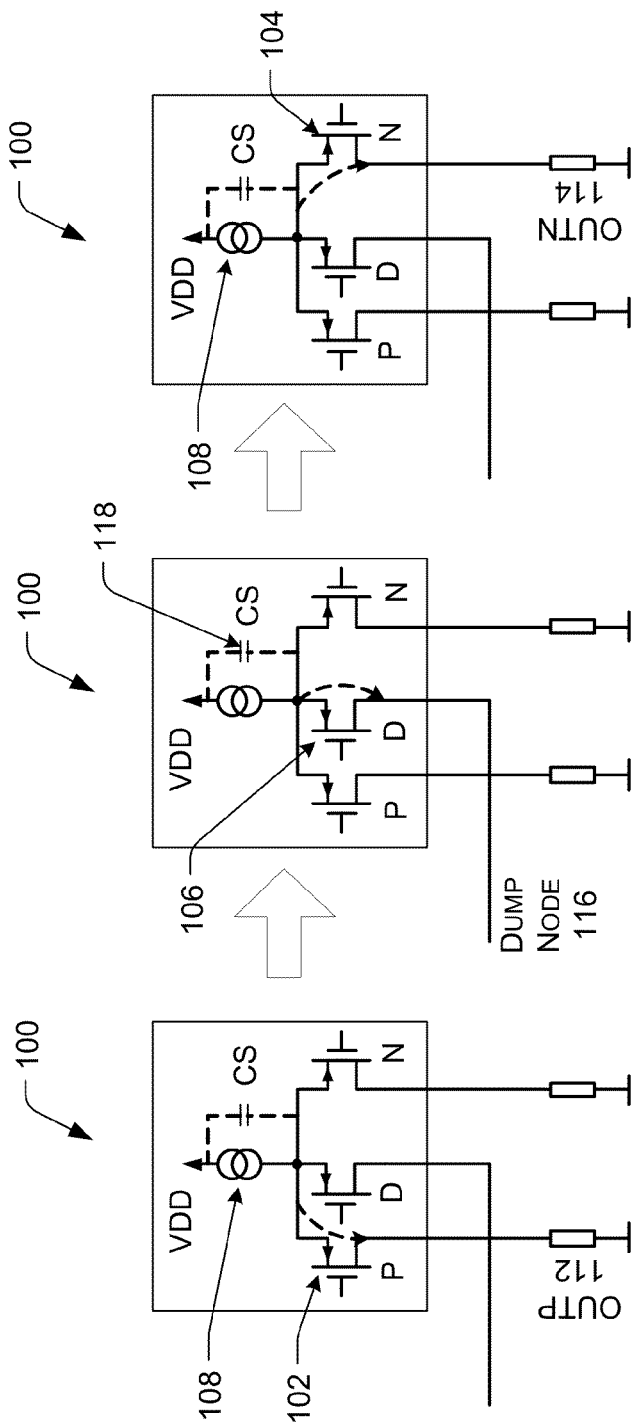
FIG. 2 is a schematic diagram illustrating one example of applying a switching technique to the DAC cell of FIG. 1.

FIG. 2 is a schematic diagram illustrating one example of applying a switching technique to the DAC cell 100 of FIG. 1. As illustrated in FIG. 2, in one example, the DAC cell 100 is discharged (or pre-charged) prior to changing a polarity of the DAC cell 100 from a positive output state to a negative output state. In the first (leftmost) step of FIG. 2, switch 102 is closed and switches 104 and 106 are open. Current flows from the output of the current source 108 through switch 102 (as shown by the dashed arrow) and to outp 112. The DAC cell 100 is in a positive output state.

In an implementation, information is received indicating that the DAC cell 100 is to change to the negative output state. As shown in the second (middle) step of FIG. 2, switches 102 and 104 are open, and switch 106 closes. In this intermediate step, any charge associated with Cs 118 discharges through switch 106 (as shown by the dashed arrow) and to dump node 116, assuming a constant potential at dump node 116. In an alternate implementation, dump node and switch 106 may be used to pre-charge Cs 118, as will be discussed further below. After this intermediate step, the charge on Cs 118 is no longer proportional to the voltage on outp 112 but rather to the voltage on the dump node 116.

In the third (rightmost) step of FIG. 2, switch 104 is closed and switches 102 and 106 are open. Current flows from the output of the current source 108 through switch 104 (as shown by the dashed arrow) and to outn 114. The DAC cell 100 is now in a negative output state, having changed polarity. Any charge flowing from Cs 118 into the output outn 114 is now proportional to the voltage difference v(outn)−v(dump node) instead of v(outn)−v(outp). Thus, a reduced, if not eliminated, switching related charge error is associated with outn 114.

Without the intermediate dump step, the dynamic charge error can be described as $Q(k)=r \cdot C_s \cdot (v_{out}(k)-v_{out}(k-1))$, where k is the switching instance, r is a factor to account for attenuation from the output to the source node 110 of the switches (102, 104, and 106) $v_{out}(k)$ is the voltage at the drain of the active switch at switching instance k and $v_{out}(k-1)$ is the voltage at the drain of the active switch at the last switching instance. If the DAC cell 100 does not change polarity at a switching instance, this error is zero. If the DAC cell 100 is switching, without the intermediate dump step, the error will be a function of the voltage difference of the output nodes and is signal dependent.

With the intermediate dump step, the dynamic error when connecting a DAC cell 100 to an output node via a switch is changed to $Q(k)=r \cdot C_s \cdot (v_{out}(k)-v_{dump})$. As long as $(v_{out}(k)-v_{dump})<(v_{out}(k)-v_{out}(k-1))$, the dynamic error is reduced. This condition can be fulfilled if $v_{dump}$ is the midscale voltage of the DAC cell 100 (i.e., the average of the voltages of outp 112 and outn 114). The voltage difference at the switching instance is then half of what it is without the intermediate dump step.

In one implementation, the dynamic error is reduced further when the dump node 116 is arranged to follow the voltage of the next output node (e.g., outp 112, outn 114) to which the DAC cell 100 will activate. For example, if the DAC cell 100 is to make a polarity change from outn 114 to outp 112 in a next switching cycle, the dump node 116 is charged to the voltage at outp 112 prior to the polarity switch. The voltage difference at the switching instance can then be reduced to substantially zero, and no dynamic charge error is injected into the output node outp 112. In some implementations, the dump node 116 voltage is generated such that the resulting charge error is signal independent, resulting in improved dynamic linearity of the DAC.

In one implementation, the DAC cell 100 includes a fourth switch (see FIG. 6, "D2") controlling a second dump node. The fourth switch D2 is also arranged to have a first terminal coupled to the output of the current source 108 to discharge (or pre-charge) a voltage at the output of the current source 108 prior to one of switch 102 or switch 104 toggling when the other of switch 102 or switch 104 has toggled, or switch 106 has toggled. The fourth switch D2 is discussed further below (with reference to FIGS. 6 and 7). In various implementations, the DAC cell 100 may alternately or additionally include other switches.

Example Switching Control

Figure 3:
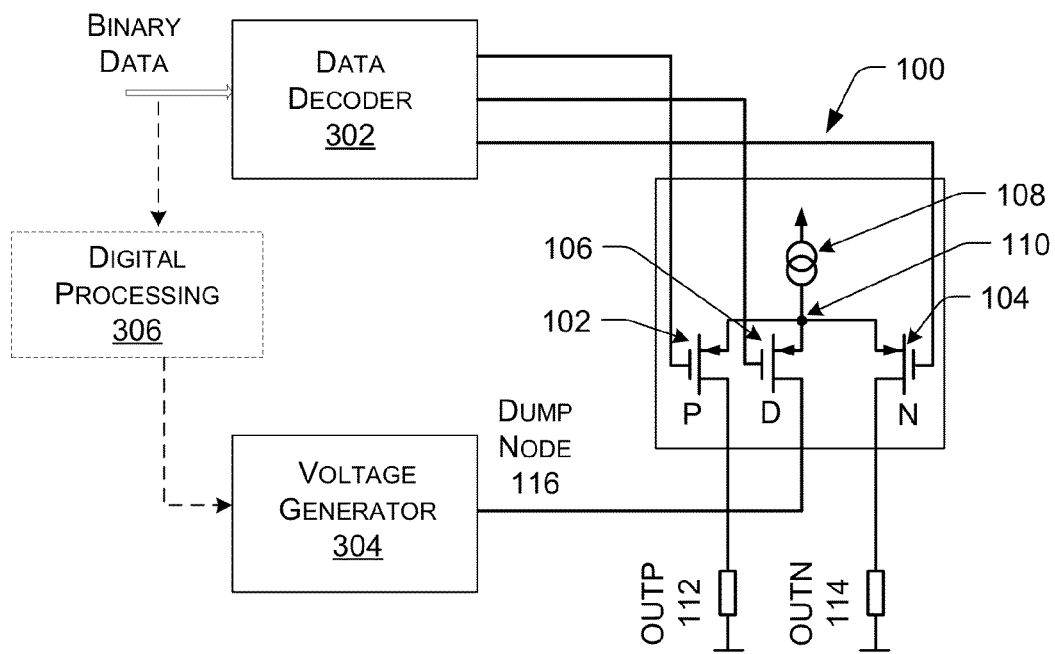
FIG. 3 is a schematic of the example DAC cell of FIG. 1, implemented with control functionality.

FIG. 3 is a schematic of the example DAC cell 100 of FIG. 1, implemented with control functionality. In an implementation, as shown in FIG. 3, a DAC cell 100 may be applied with a data decoder 302 arranged to determine timing for each of the switches (102, 104, and 106) to toggle. For example, a data decoder 302 may receive binary data or digital code, and may direct one or more of the switches 102, 104, and 106 to toggle based on the data received. In one implementation, the data decoder 302 may send control signals or the like to the switches 102, 104, and 106 to direct one or more of them to toggle. In the implementation illustrated in FIG. 3, signal lines connect the data decoder 302 to the gates of the switches 102, 104, and 106, providing a path for control signals or the like.

In one implementation, the data decoder 302 directs the switch 106 to toggle after directing one of switch 102 or switch 104 to toggle and prior to directing the other of switch 102 or switch 104 to toggle. In other words, the data decoder 302 directs the DAC cell 100 to the dump state prior to directing the DAC cell 100 to change output polarity states.

In an implementation, as shown in FIG. 3, a DAC cell 100 may be applied with a voltage generator 304. As illustrated, the voltage generator is coupled to an output terminal of switch 106, i.e., the dump node. In an implementation, the voltage generator 304 is arranged to pre-charge node 110 at the output of the current source 108. For example, the voltage generator 304 may pre-charge node 110 to a voltage substantially equal to an average of the voltage at output outp 112 and the output outn 114, as discussed above. In another implementation, the voltage generator 304 may pre-charge node 110 to a voltage substantially equal to the voltage of the next output node (e.g., outp 112, outn 114) to which the DAC cell 100 will activate, as also discussed above. In various implementations to be discussed below, the voltage generator 304 may pre-charge node 110 to other voltages according to the applied switching technique.

In an implementation, as shown in FIG. 3, a DAC cell 100 may be applied with an optional digital processing component 306. In various implementations, the digital processing component 306 may provide information to the voltage generator 304 regarding a "next output node" that the DAC cell 100 will be activating. For example, the digital processing component 306 may communicate to the voltage generator 304 that the DAC cell 100 will change output polarity in the next switching cycle. In one implementation, the digital processing component 306 may monitor the incoming data.

In various implementations, one or more of the data decoder 302, voltage generator 304, and digital processing component 306, as well other components, may be implemented in hardware, firmware, software, or the like, or in combinations thereof.

Example DAC Cell Arrays

In an implementation, a DAC cell array may comprise a number of DAC cells 100 arranged in an array. In one implementation, the DAC cell array includes a first quantity of primary DAC cells and a second quantity of redundant DAC cells. In one implementation, the number of redundant DAC cells is a fraction of the number of primary DAC cells. Generally, the number of primary DAC cells is based on the type of signals processed by the DAC cell array, and the resolution desired. For example, a 5-bit DAC may have $2^5=32$ DAC cells 100, giving 32 possible output levels.

Figure 4:
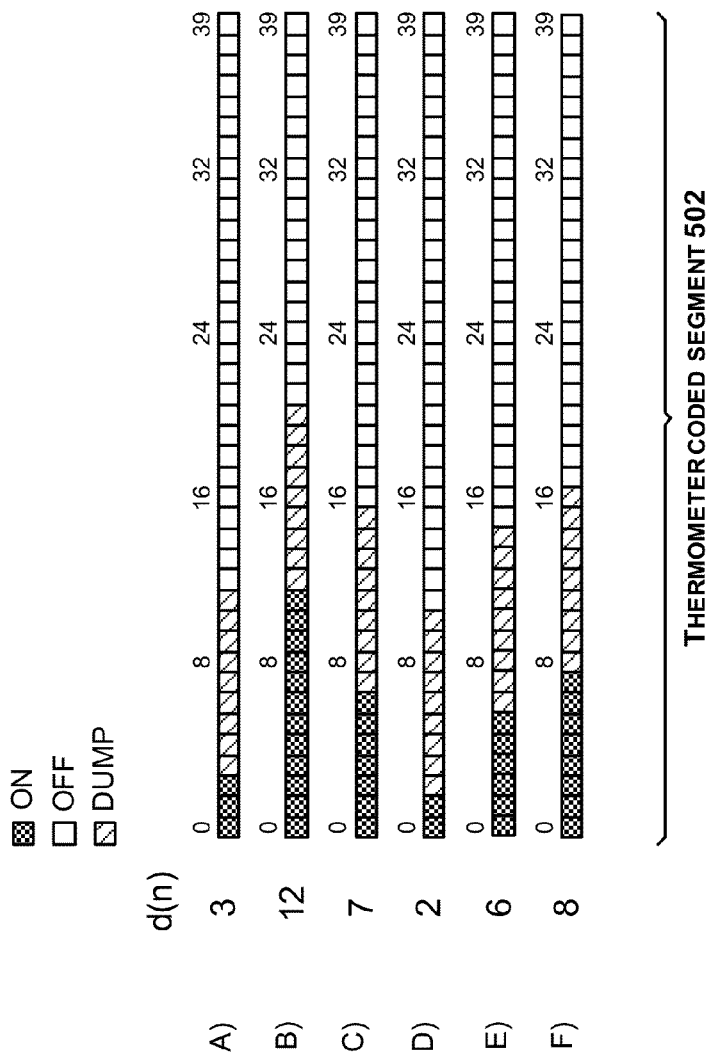
FIG. 4 is an illustration showing an example switching technique according to one implementation. The illustration includes a partial set of redundant DAC cells.

FIG. 4 is an illustration showing how an example switching technique may be applied according to one implementation using an array of DAC cells 100. The illustration shows a thermometer coded segment 502 representing an array of 40 DAC cells 100. In the example, 31 of the 40 DAC cells 100 are primary DAC cells, representative of a 5-bit DAC. The other 9 DAC cells are redundant DAC cells for implementing a switching technique that uses a dump state, as discussed above. In various implementations, at least a portion of the DAC cells 100 in an array is in the dump state during each switching cycle. In the illustration, the array of 40 DAC cells 100 is shown in six different cases (A-F) for six different digital input codes d(n).

As shown in the example illustration of FIG. 4, each of the primary DAC cells and the redundant DAC cells are in either a positive ("ON") output state, a negative ("OFF") output state, or a dump state. In one implementation, as seen in FIG. 4, the DAC cells 100 are linearly arranged so that the DAC cells 100 in the dump state are in between DAC cells 100 that are "ON" and DAC cells that are "OFF." In the implementation, a switching technique (i.e., order) can be applied whereby a DAC cell 100 is switched to a dump state rather than being switched directly to an opposite polarity state, and a redundant DAC cell 100 that was previously in a dump state is switched to the opposite polarity state instead.

For example, if additional DAC cells 100 are needed in the positive state, based on a digital input in a next switching cycle, DAC cells 100 that were in a dump state in the previous switch cycle are set to the "ON" state. The same quantity of DAC cells 100 that were in the "OFF" state are switched to the dump state. Alternately, if fewer DAC cells 100 are needed in the positive state, based on the digital input in a next switching cycle, DAC cells 100 that were in a "ON" state in the previous switch cycle are set to the dump state. The same quantity of DAC cells 100 that were in the dump state are switched to the "OFF" state. Thus, in one implementation, the combined quantity of DAC cells 100 that is "ON" and "OFF" during any switch cycle stays constant. Also, in an implementation, the quantity of DAC cells 100 in the dump state remains constant for each switch cycle.

Referring to FIG. 4, at line A, a digital input value of 3 is represented by three "ON" state DAC cells 100 in the thermometer coded segment 502. They are followed by nine "dump" state DAC cells and 28 "OFF" state DAC cells 100. At line B, a digital input value of 12 is represented. To transition from the arrangement of line A to the arrangement of line B, nine DAC cells 100 that were in the dump state are switched to the "ON" state, making a total of 12 DAC cells 100 in the "ON" state. Additionally, nine DAC cells 100 that were in the "OFF" state are switched to the dump state, making a total of 31 DAC cells 100 that are "ON" and "OFF," and a total of nine DAC cells 100 in the dump state.

At line C of FIG. 4, a digital input value of 7 is represented. To transition from the arrangement of line B to the arrangement of line C, five DAC cells 100 that were in the "ON" state are switched to the dump state, making a total of seven DAC cells 100 in the "ON" state. Additionally, five DAC cells 100 that were in the dump state are switched to the "OFF" state, making a total of 31 DAC cells 100 that are "ON" and "OFF," and a total of nine DAC cells 100 in the dump state. This technique continues for the other lines D-F.

In the implementation discussed, the DAC cells 100 in a given state are grouped in sets, and the sets are linearly arranged so that the DAC cells 100 in the dump state are in logically between DAC cells 100 that are "ON" and DAC cells 100 that are "OFF." In this implementation, the DAC cells 100 that switch from "ON" to "dump" are those that are closest to the dump state DAC cells (the last ones in the "ON" set in the illustration). Additionally, the DAC cells 100 that switch from "dump" to "OFF" are those that are closest to the "OFF" state DAC cells (the first ones in the "OFF" set in the illustration). This technique generally prevents a DAC cell 100 from making a direct polarity switch without an intermediate step in a "dump" state and minimizes dynamic switch errors, provided that the digital input code step is smaller or at most equal to the number of redundant DAC cells in the array. Otherwise, there is an error related to the direct polarity switch of DAC cells, but it will be smaller than with the non-redundant standard implementation of a DAC-array.

The number of redundant DAC cells needed for full functionality of the discussed switching technique is $\max(d(k)-d(k-1))/d_{cell}$ where $d(k)$ is the digital input word at the sampling instance k and $d_{cell}$ is the normalized value of one DAC cell 100 in the array. In other words, the necessary number of redundant DAC cells 100 is related to the maximum derivative of the signal. For a known signal and a given DAC architecture, the number of redundant DAC cells 100 can be calculated.

In an alternate implementation, if the signal change is bigger than the number of available DAC cells 100 currently in the dump state, the additional number of DAC cells 100 that are needed may be switched directly to the opposite polarity, without an intermediate step. New "dump" DAC cells 100 that were "OFF" DAC cells 100 or "ON" DAC cells 100 are appended after the DAC cells 100 in the "ON" state, maintaining a constant quantity of combined "ON" and "OFF" DAC cells 100 and a constant quantity of "dump" state DAC cells 100. In such an implementation, this is a partial fulfillment of the switching technique and, therefore, results in a partial charge error reduction.

Example Implementations

Figure 5:
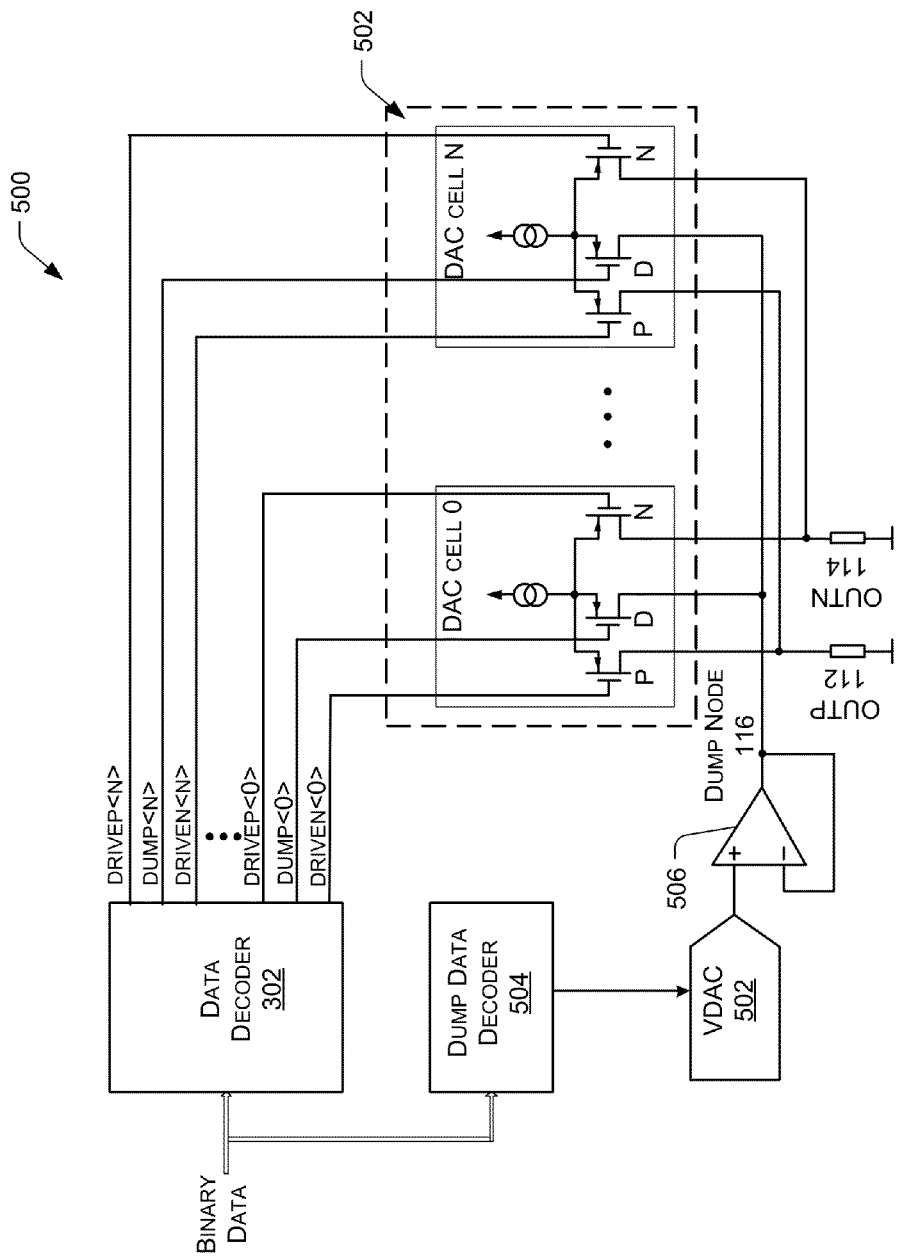
FIG. 5 is a block diagram of an array of DAC cells and control functionality, according to an example implementation. The control functionality includes one example of input data monitoring and application.

FIG. 5 is a block diagram of a system 500 that includes a DAC cell array 502 ("array 502") and control functionality, according to an example implementation. The array 502 may be comprised of one or more DAC cells 100 (shown as DAC cells 0 to N in FIG. 5) as discussed above. Further, the switching techniques discussed above with reference to FIG. 4 may be applied to the array 502 and one or more components of system 500.

In one implementation, the system 500 may include an array 502 of DAC cells 100 comprising a first quantity of primary DAC cells and a second quantity of redundant DAC cells, where the second quantity is a fraction of the first quantity, as discussed above. In an implementation, each of the primary DAC cells and the redundant DAC cells are in one of a positive output state, a negative output state, or a dump state. Additionally, the array 502 may include one or more control components arranged to determine an output state for the DAC cells 100 during a switching cycle. For example, the control component(s) may be arranged to direct a DAC cell 100 to switch to the dump state prior to directing the DAC cell 100 to switch to one of the positive output state or the negative output state from the other of the positive output state or the negative output state. In one implementation, the control component(s) direct one or more DAC cells 100 to refrain from switching states during a switching cycle, at least for economic purposes.

In one implementation, as illustrated in FIG. 5, a control component is a data decoder 302, as discussed above. Accordingly, the data decoder 302 may be arranged to generate control signals for the DAC cells 100 according to a digital input word (e.g., binary data). The control signals generated determine an output state for the DAC cells 100 during a switching cycle.

In one implementation, the system 500 may include a voltage digital-to-analog converter (VDAC) 502, as illustrated in FIG. 5, or another type of voltage generator (such as voltage generator 304). For the purposes of discussion regarding FIGS. 3-5 and 7 of this disclosure, the terms VDAC 502 and voltage generator 304 are interchangeable, as describing a component that generates a signal applied at one or more dump nodes (such as dump node 116). Accordingly, a voltage generator 304 may be arranged to apply a dump signal at an output of the DAC cells 100 associated with the dump state, as discussed above.

In an implementation, the voltage generator 304 is arranged to generate a dump signal based on an input signal to the array and/or an output signal of the array. For example, the dump signal may be based on data received from the data decoder 302 or from the dump node 116. Accordingly, in various implementations, the dump signal generated may have different forms.

In one implementation, the dump signal voltage is substantially equal to a voltage to be output by the one or more DAC cells 100 during a next switching cycle. In another implementation, the voltage generator 304 is arranged to output a constant signal substantially equal to an average of a voltage output by a DAC cell 100 while in the positive state and a voltage output by the DAC cell 100 while in the negative state.

In a further implementation, the voltage generator 304 is arranged to generate a random dump signal applied at an output of the DAC cells 100 associated with the dump state. Alternately, the dump signal has a preset varying waveform. In further implementations, the voltage generator 304 may be arranged to generate other types and forms of dump signals that serve to reduce the dynamic switch error to greater or lesser degrees.

In the example illustrated in FIG. 5, the system 500 includes a dump data decoder 504. In an implementation, the dump data decoder 504 may perform the functions of the digital processing component 306 as described with reference to FIG. 3. Optionally, the system 500 may include other control components such as a buffer 506. A unity gain buffer 506, or the like, may be used to improve the driving capability of the voltage generator 304 (or VDAC 502) as to the properties of a dump signal to be generated.

Figure 6:
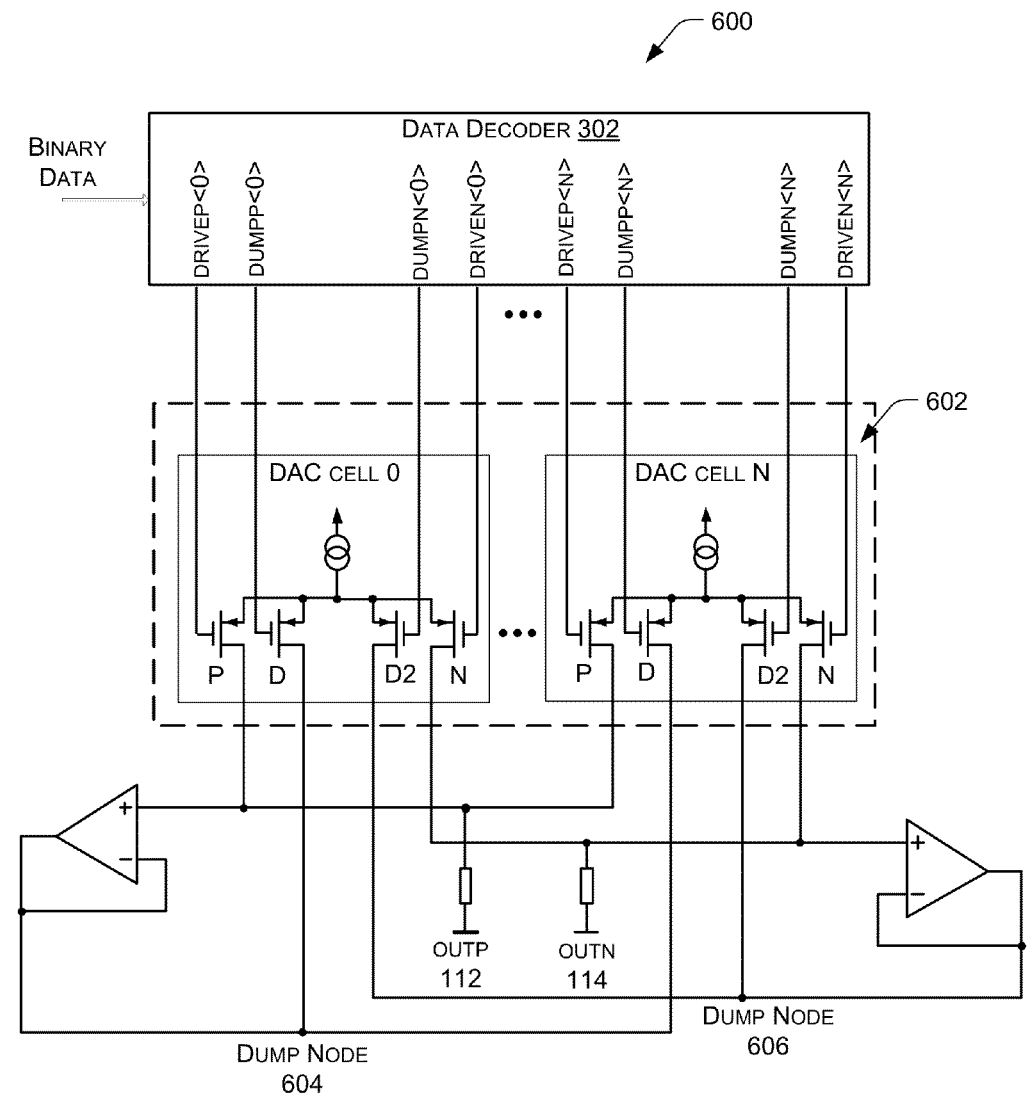
FIG. 6 is a block diagram of an array of DAC cells and control functionality, according to another example implementation where switching techniques are applied.
Figure 7:
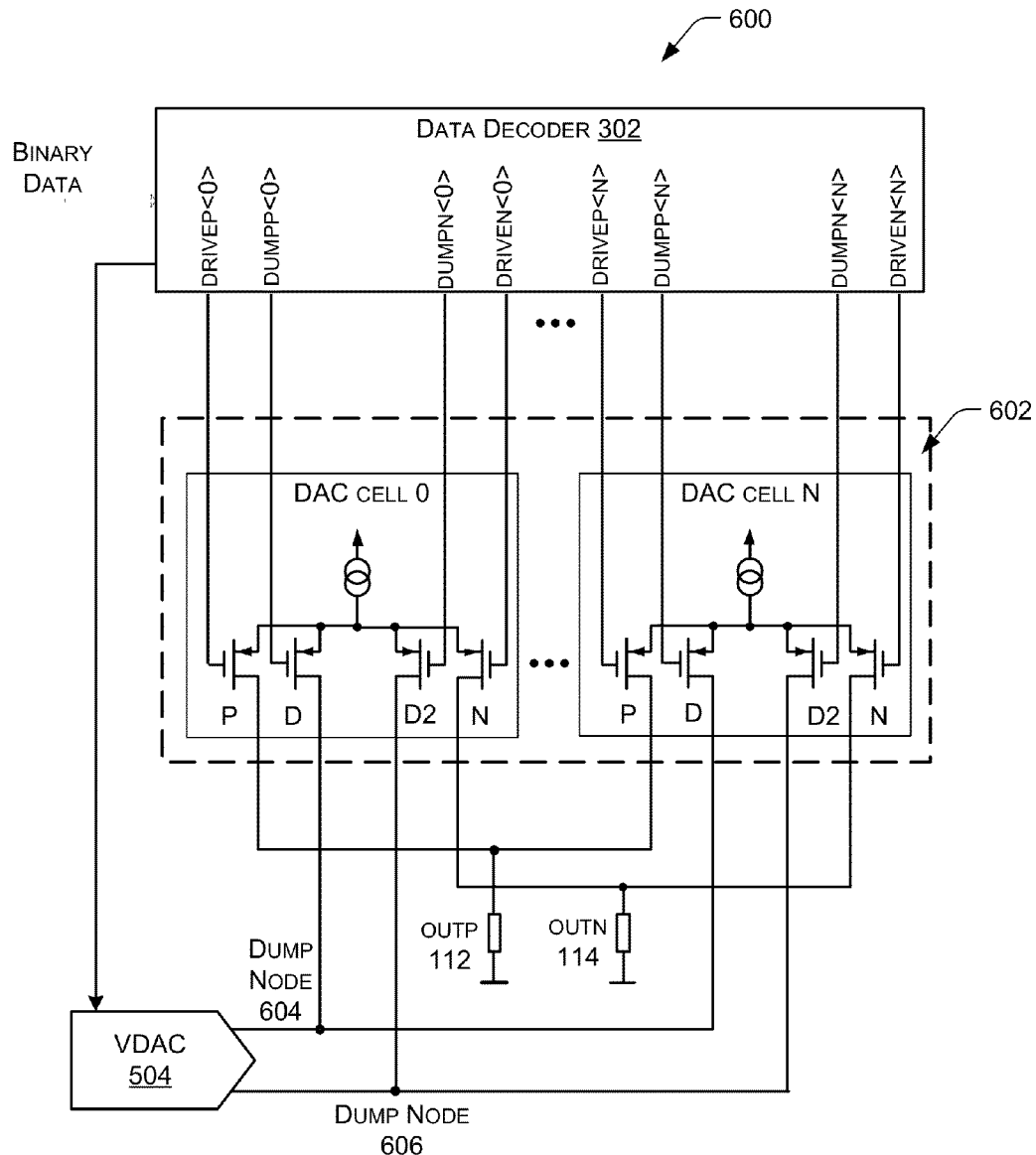
FIG. 7 is a block diagram of an array of DAC cells and control functionality, according to a further example implementation.

FIGS. 6 and 7 are block diagrams of a system 600 comprising an array 602 of DAC cells 100. System 600 is functionally similar to system 500 described above, and may contain many or all of the same control components and/or functionality. Array 602 is functionally similar to array 502, except the DAC cells 100 of array 602 are comprised of four or more switches and four or more outputs as described above with reference to FIG. 2. As mentioned above, DAC cells 100 of array 602 include at least dump switches D and D2. Accordingly there are at least two dump nodes (604 and 606).

In an implementation, the data decoder 302 determines which dump switch (D or D2) to use in a switching cycle. In one implementation, one dump switch ("D") is used in association with the "ON" state of the DAC cell 100 and one dump switch ("D2") is used in association with the "OFF" state of the DAC cell 100. In another implementation, the dump node (604 or 606) with the voltage to which a DAC cell 100 is to be switched next is used for the dump operation in a switch cycle. In one implementation, both of the dump switches may be used in a switching cycle. For example, the DAC cell 100 may change from one output polarity to the other only after both dump nodes (604 and 606) are activated as intermediate states, either concurrently or consecutively.

The diagrams of FIGS. 6 and 7 show two possible approaches using a system 600 and an array 602. In various implementations, the two approaches may be mixed, or another approach may be used to accomplish error reduction goals. In the approach of FIG. 6, the dump node voltages are generated by buffering the output voltages of the DAC.

In the approach of FIG. 7, a dual dump node design, for example, can also be realized with a voltage DAC 504. In an implementation, the VDAC 504 is controlled by the data decoder 302, generating dump node voltages that follow the output voltages. Thus, the DAC cells 100 are dumped to the dump node (604 or 606) that follows the voltage of the output to which they will be switched next.

In alternate implementations, one or more of the above techniques may be employed concurrently, or another technique may be used to accomplish the same or similar results. Further, in various implementations, one or more of the above techniques may be applied once each switching cycle or according to another timing scheme.

Representative Processes

Figure 8:
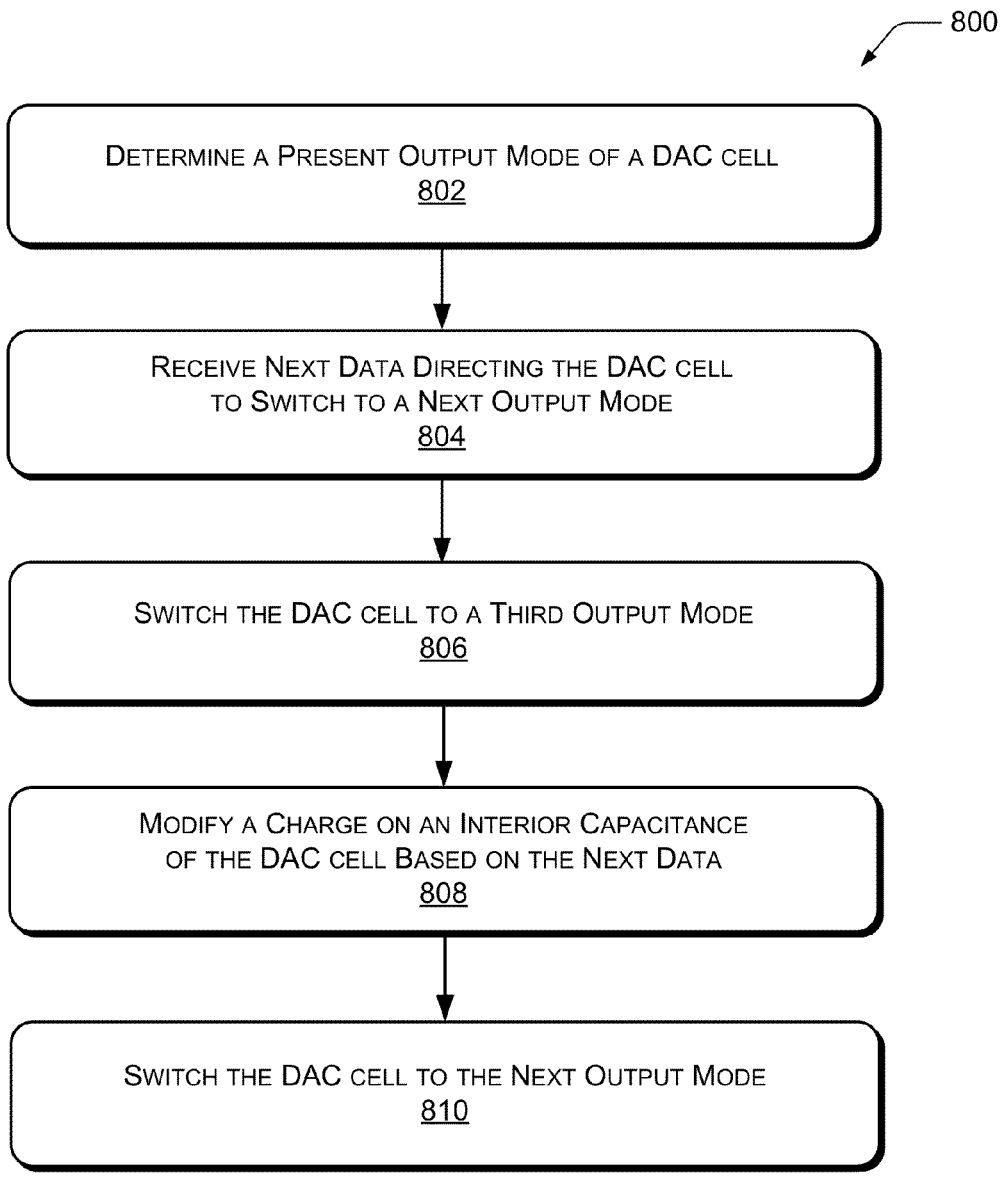
FIG. 8 is a flow diagram illustrating an example process of switching the output states of a DAC cell, according to an implementation.

FIG. 8 illustrates a representative process 800 for implementing switching techniques for a DAC cell (such as the DAC cell 100). The described techniques may also be used with an array (such as array 500 or 600) of DAC cells 100. An example process 800 comprises including an intermediate state when changing an output polarity of a DAC cell 100, to minimize dynamic switch error. The process 800 is described with reference to FIGS. 1-7.

At block 802, the process includes determining a present output mode of a DAC cell based on extant input data. For example, the DAC cell may be set to a positive, negative, or dump state, based on the input data currently being applied.

At block 804, the process includes receiving next data directing the DAC cell to switch from the present output mode to a next output mode during a subsequent switching cycle. In some cases the next output mode may be the same as the present output mode. In other cases, the next output mode may be an opposite polarity mode.

At block 806, the process includes switching the DAC cell to a third output mode if the next output mode is an opposite polarity mode. The third output mode comprises an intermediate state that is applied rather than directly changing the output polarity of the DAC cell. In one implementation, the process includes deactivating a positive output of the DAC cell and a negative output of the DAC cell and activating an intermediate output of the DAC cell prior to changing an output polarity of the DAC cell.

In one implementation, where there are at least two dump nodes associated with a DAC cell, the process includes deactivating the intermediate output of the DAC cell and activating a second intermediate output of the DAC cell prior to changing an output polarity of the DAC cell.

At block 808, the process includes modifying a charge on an interior capacitance of the DAC cell based on the next data. For example, modifying the charge may include one of resetting, discharging, or pre-charging the interior capacitance of the DAC cell based on the next data. In one implementation, the process includes monitoring a signal derivative of the next data, and modifying the charge on the interior capacitance of the DAC cell based on the signal derivative.

In an implementation, the process includes pre-charging the interior capacitance of the DAC cell to a voltage that is substantially equal to half of a difference between a voltage at the positive output of the DAC cell and a voltage at the negative output of the DAC cell. Alternately, the process may include pre-charging the interior capacitance of the DAC cell to a voltage that is substantially equal to a voltage at an output of the DAC cell associated with the next output mode. Accordingly, some information regarding the next output mode may be provided by one or more control components, as discussed above.

At block 810, the process includes switching the DAC cell to the next output mode. Once the intermediate step is accomplished, and the interior capacitance charge is modified if desired, the DAC cell may be switched with reduced error.

Figure 9:
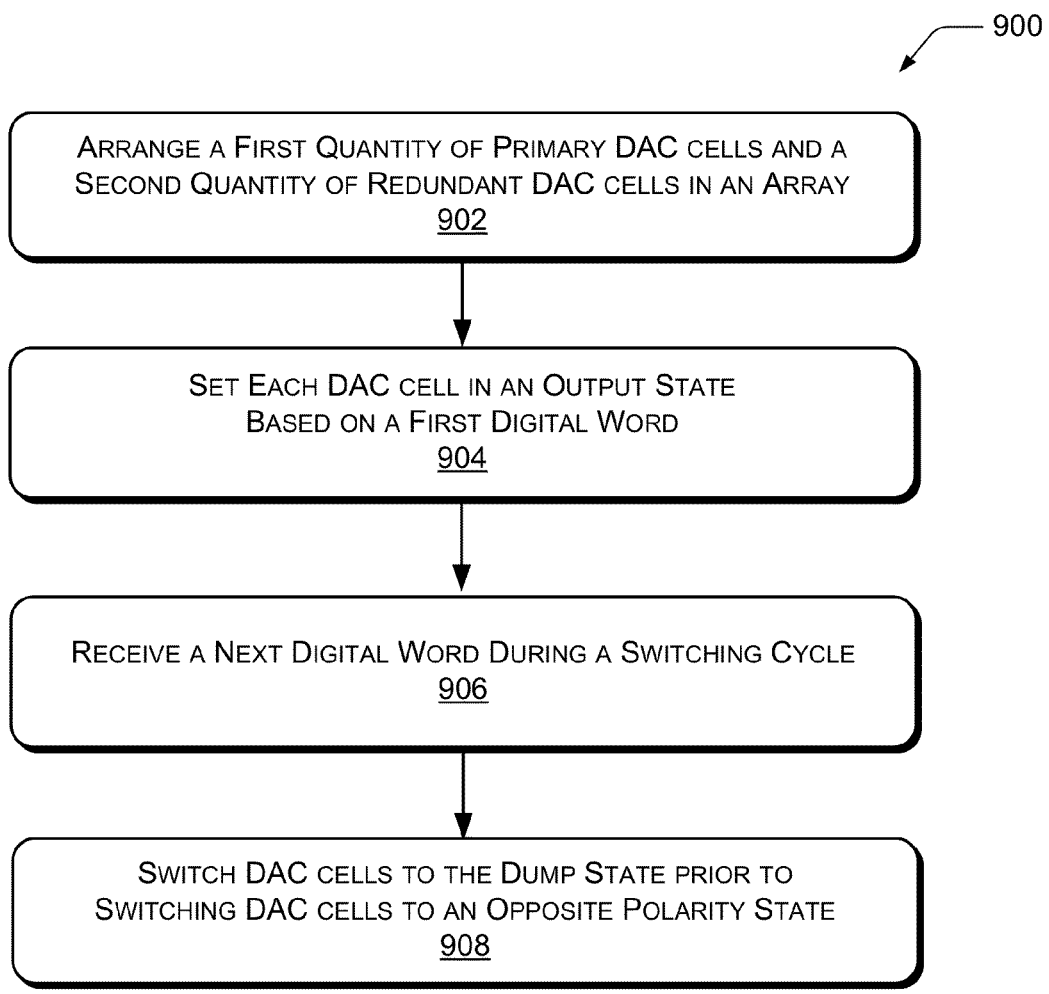
FIG. 9 is a flow diagram illustrating an example process of switching the output states of an array of DAC cells, using a partial set of redundant DAC cells.

FIG. 9 illustrates a representative process 900 for implementing switching techniques for an array (such as array 500 or 600) of DAC cells 100. An example process 900 comprises the use of redundant DAC cells 100 when including an intermediate state to change an output polarity of a DAC cell 100. The process 900 is described with reference to FIGS. 1-7.

At block 902, the process includes arranging a first quantity of primary DAC cells and a second quantity of redundant DAC cells in an array. In one example, the second quantity is a fraction of the first quantity. In one implementation, the second quantity is based on a maximum derivative of a signal being processed by the array of DAC cells.

At block 904, the process includes setting each of the DAC cells in one of a positive output state, a negative output state, or a dump state based on a first digital word. Each bit of the first digital word is represented by at least one DAC cell. In one implementation, a quantity of DAC cells in the dump state remains constant during each switching cycle and/or a combination sum of DAC cells in the "ON" and "OFF" states is constant during each switching cycle.

At block 906, the process includes receiving a next digital word during a switching cycle. The next digital word informs the DAC cells as to the next output state of the DAC cells. In response to receiving the next digital word, the process includes switching one or more DAC cells from the positive output state to the dump state, from the negative output state to the dump state, or from the dump state to one of the positive output state or the negative output state, based on the next digital word.

In one implementation, the process includes detecting the next digital word prior to the next switching cycle, and discharging or pre-charging the one or more DAC cells based on the next digital word prior to the next switching cycle.

At block 908, the process includes switching one or more DAC cells to the dump state prior to switching the one or more DAC cells to an opposite polarity state in response to the next digital word.

In an implementation, the process includes arranging the array of DAC cells in a linear order comprising: a first set comprising positive output state DAC cells; a next set comprising dump state DAC cells; and a last set comprising negative output state DAC cells. When switching an output state of one or more positive output state DAC cells, the process includes switching the positive output state DAC cells within the first set in an order from last to first. Also or alternatively, when switching an output state of one or more negative output state DAC cells, the process may include switching the negative output state DAC cells within the last set in an order from first to last.

The order in which the processes 800 and 900 are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable hardware, software, firmware, or a combination thereof, without departing from the scope of the subject matter described herein.

In alternate implementations, other techniques may be included in the processes 800 and 900 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing the invention.

What is claimed is:

1. A digital to analog converter (DAC) comprising:
   a current source;
   a first switch having a first terminal coupled to an output of the current source and having a second terminal coupled to a first output of the DAC;
   a second switch having a first terminal coupled to the output of the current source and having a second terminal coupled to a second output of the DAC;
   a third switch having a first terminal coupled to the output of the current source and a second terminal defining a dump node, the third switch arranged to discharge a voltage at the output of the current source prior to one of the first switch or the second switch toggling when the other of the first switch or the second switch has toggled; and
   a data decoder arranged to determine a timing for each of the first, second, and third switches to toggle, based on data received at the data decoder.

2. The DAC of claim 1, further comprising a voltage generator coupled to the dump node, the voltage generator to generate a signal to influence the dump node.

3. The DAC of claim 1, wherein the data decoder directs the third switch to toggle after directing one of the first switch or the second switch to toggle and prior to directing the other of the first switch or the second switch to toggle.

4. The DAC of claim 1, wherein the third switch is further arranged to pre-charge a node at the output of the current source to a preset voltage prior to one of the first switch or the second switch toggling when the other of the first switch or the second switch has toggled.

5. The DAC of claim 1, further comprising a voltage generator coupled to an output terminal of the third switch, the voltage generator arranged to pre-charge a node at the output of the current source to a voltage substantially equal to an average of a voltage at the first output and the second output of the DAC.

6. The DAC of claim 1, further comprising a fourth switch having a first terminal coupled to the output of the current source, the fourth switch arranged to discharge a voltage at the output of the current source prior to one of the first switch or the second switch toggling when the other of the first switch or the second switch has toggled or the third switch has toggled.

7. A system comprising:
   an array of digital to analog converter (DAC) cells comprising:
   a first quantity of primary DAC cells; and
   a second quantity of redundant DAC cells, the second quantity being a fraction of the first quantity,
   each of the primary DAC cells and the redundant DAC cells being in one of a positive output state, a negative output state, or a dump state; and
   a control component arranged to determine an output state for the DAC cells during a switching cycle, the control component arranged to direct a DAC cell to switch to the dump state prior to directing the DAC cell to switch to one of the positive output state or the negative output state from the other of the positive output state or the negative output state.

8. The system of claim 7, further comprising a voltage generator arranged to generate a dump signal based on at least one of an input signal to the array and an output signal of the array, the dump signal applied at an output of the DAC cells associated with the dump state.

9. The system of claim 8, wherein the voltage generator is arranged to output a constant signal substantially equal to an average of a voltage output by a DAC cell while in the positive state and a voltage output by the DAC cell while in the negative state.

10. The system of claim 7, further comprising a voltage generator arranged to generate a random dump signal, the random dump signal applied at an output of the DAC cells associated with the dump state.

11. The system of claim 7, further comprising a voltage generator arranged to generate a dump signal having a preset varying waveform, the dump signal applied at an output of the DAC cells associated with the dump state.

12. The system of claim 7, further comprising a data decoder arranged to generate control signals for the DAC cells according to a digital input word, the control signals arranged to determine an output state for the DAC cells during a switching cycle.

13. The system of claim 12, further comprising a voltage generator coupled to an output of the DAC cells associated with the dump state, the voltage generator arranged to generate a voltage for one or more of the DAC cells based on data received from the data decoder, wherein the voltage is substantially equal to a voltage to be output by the one or more DAC cells during a next switching cycle.

14. The system of claim 1, wherein the control component directs one or more DAC cells to refrain from switching states during a switching cycle.

15. The system of claim 1, wherein a sum of DAC cells in a positive output state plus DAC cells in a negative output state remains constant during each switching cycle.

16. The system of claim 1, wherein at least a portion of the DAC cells of the array is in the dump state during each switching cycle.

17. A method of switching a digital to analog converter (DAC) cell, comprising:
   determining a present output mode of a DAC cell based on extant input data;
   receiving next data directing the DAC cell to switch from the present output mode to a next output mode during a subsequent switching cycle;
   switching the DAC cell to a third output mode;
   modifying a charge on an interior capacitance of the DAC cell based on the next data; and
   switching the DAC cell to the next output mode.

18. The method of claim 17, further comprising deactivating a positive output of the DAC cell and a negative output of the DAC cell and activating an intermediate output of the DAC cell prior to changing an output polarity of the DAC cell.

19. The method of claim 18, further comprising pre-charging the interior capacitance of the DAC cell to a voltage that is substantially equal to half of a difference between a voltage at the positive output of the DAC cell and a voltage at the negative output of the DAC cell.

20. The method of claim 18, further comprising deactivating the intermediate output of the DAC cell and activating a second intermediate output of the DAC cell prior to changing an output polarity of the DAC cell.

21. The method of claim 17, further comprising monitoring a signal derivative of the next data, and modifying the charge on the interior capacitance of the DAC cell based on the signal derivative.

22. The method of claim 17, further comprising one of resetting, discharging, or pre-charging the interior capacitance of the DAC cell based on the next data.

23. The method of claim 17, further comprising pre-charging the interior capacitance of the DAC cell to a voltage that is substantially equal to a voltage at an output of the DAC cell associated with the next output mode.

24. A method of switching an array of digital to analog converter (DAC) cells, comprising:

arranging a first quantity of primary DAC cells and a second quantity of redundant DAC cells in an array, the second quantity being a fraction of the first quantity;

setting each of the DAC cells in one of a positive output state, a negative output state, or a dump state based on a first digital word, each bit of the first digital word being represented by at least one DAC cell;

receiving a next digital word during a switching cycle; and switching one or more DAC cells to the dump state prior to switching the one or more DAC cells to an opposite polarity state in response to the next digital word.

25. The method of claim 24, further comprising, in response to receiving the next digital word, switching one or more DAC cells from the positive output state to the dump state, from the negative output state to the dump state, or from the dump state to one of the positive output state or the negative output state, based on the next digital word.

26. The method of claim 25, further comprising when switching an output state of one or more negative output state DAC cells, switching the negative output state DAC cells within the last set in an order from first to last.

27. The method of claim 24, further comprising detecting the next digital word prior to the next switching cycle, and discharging or pre-charging the one or more DAC cells based on the next digital word prior to the next switching cycle.

28. The method of claim 24, further comprising arranging the array of DAC cells in a linear order comprising: a first set comprising positive output state DAC cells; a next set comprising dump state DAC cells; and a last set comprising negative output state DAC cells; and when switching an output state of one or more positive output state DAC cells, switching the positive output state DAC cells within the first set in an order from last to first.

29. The method of claim 24, wherein a quantity of DAC cells in the dump state remains constant during each switching cycle.

30. The method of claim 24, wherein the second quantity is based on a maximum derivative of a signal being processed by the array of DAC cells.

* * * * *